United States Patent [19]

Wile

[11] Patent Number: 5,362,992
[45] Date of Patent: Nov. 8, 1994

[54] ELECTRONIC CONTROL OF PEAK DETECTOR RESPONSE TIME

[75] Inventor: Donald T. Wile, San Jose, Calif.

[73] Assignee: National Semiconductor Corporation, Santa Clara, Calif.

[21] Appl. No.: 891,245

[22] Filed: Jun. 1, 1992

[51] Int. Cl.⁵ .............................................. H03K 5/24
[52] U.S. Cl. ............................................ 327/58; 327/94
[58] Field of Search ................ 307/351, 353, 359, 246

[56] References Cited

U.S. PATENT DOCUMENTS

| | | | |
|---|---|---|---|
| 3,296,581 | 1/1967 | Warner | 307/246 |
| 4,198,541 | 4/1980 | Fukushima | 307/353 |
| 4,506,169 | 3/1985 | Cole | 307/359 |
| 4,605,867 | 9/1986 | Veehof | 307/351 |
| 4,866,301 | 9/1989 | Smith | 307/246 |
| 4,996,448 | 2/1991 | Abdi | 307/359 |
| 5,025,176 | 6/1991 | Takeno | 307/359 |
| 5,038,055 | 8/1991 | Kunoshita | 307/351 |

Primary Examiner—Timothy P. Callahan
Assistant Examiner—Shawn Riley
Attorney, Agent, or Firm—Limbach & Limbach

[57] ABSTRACT

A peak detector circuit operates to charge a capacitor to a level proportional to the peak input signal level. The charging circuit includes an emitter follower driver. The response time of the charging circuit is enhanced by coupling a constant current to the emitter follower output. The constant current acts to lower the emitter follower source impedance which operates to increase the rate of capacitor charging.

5 Claims, 2 Drawing Sheets

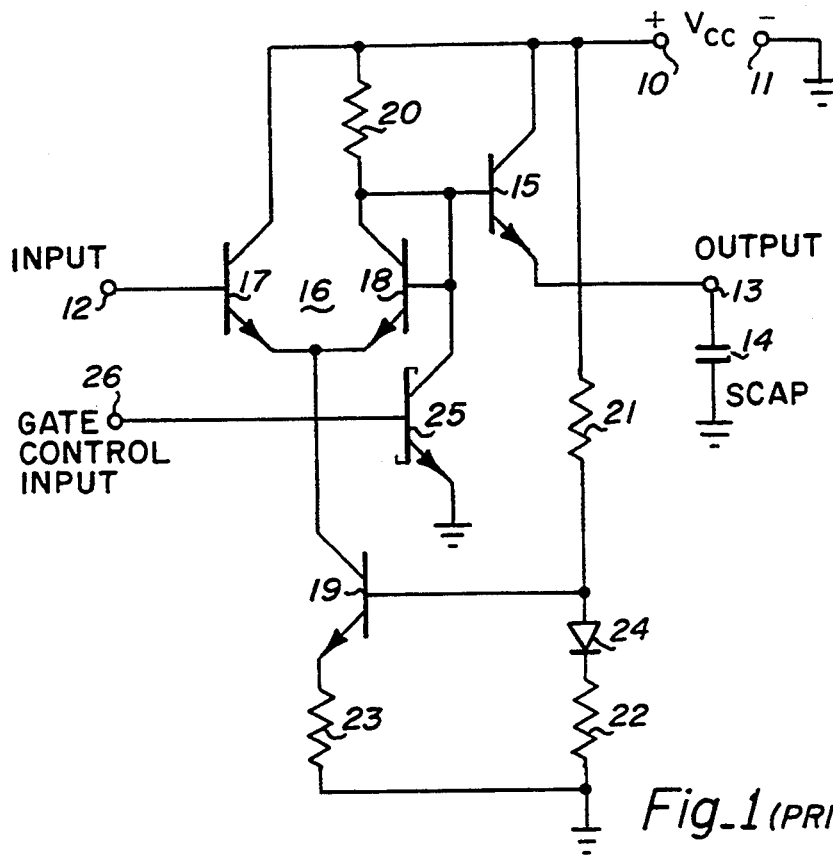
Fig_1 (PRIOR ART)
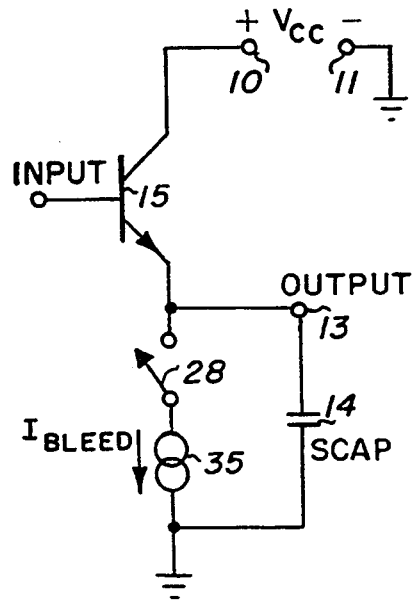
Fig_2
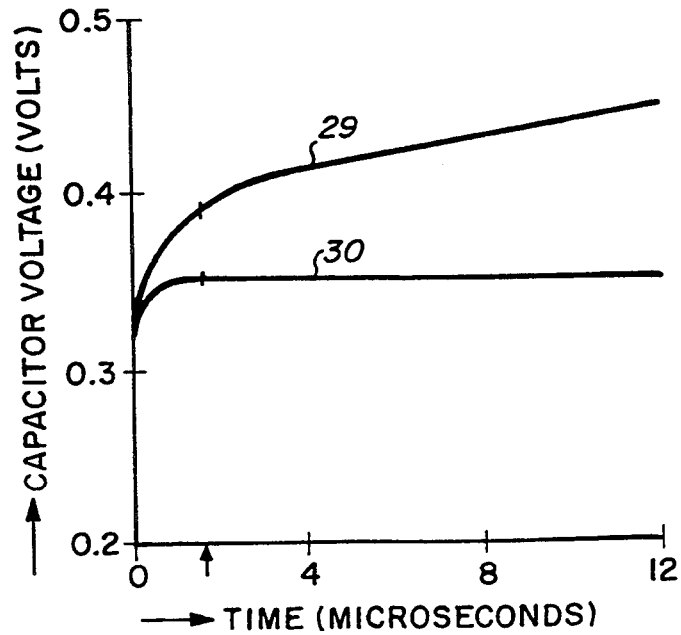
Fig_3

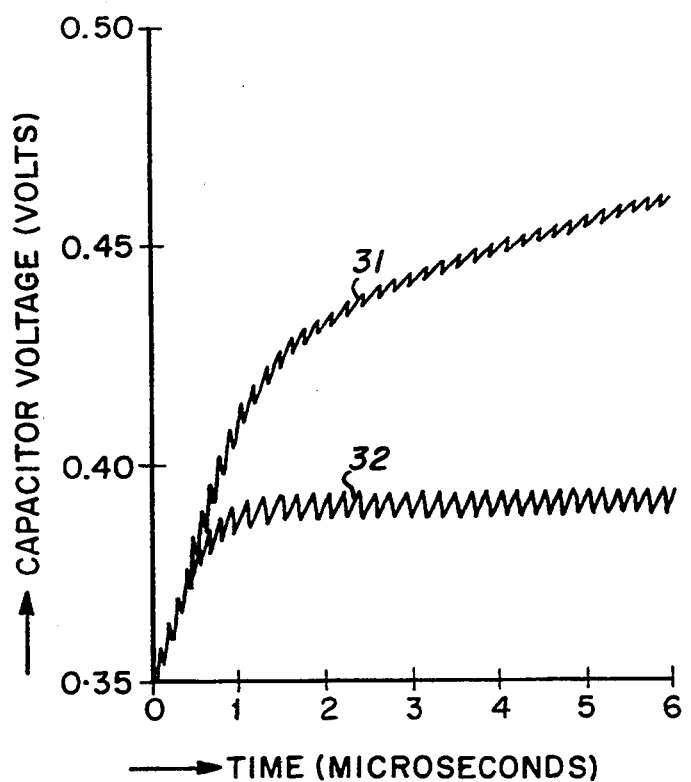
Fig_4
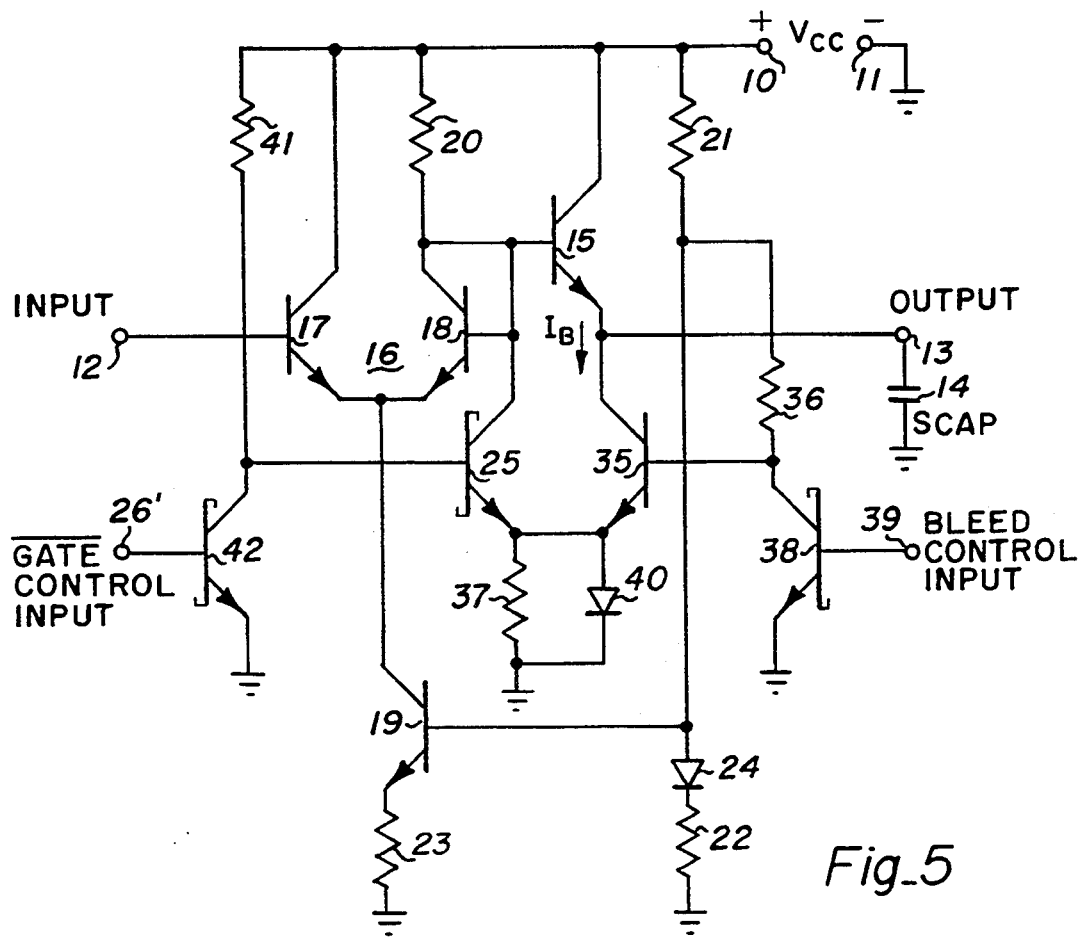
Fig_5

ELECTRONIC CONTROL OF PEAK DETECTOR RESPONSE TIME

BACKGROUND OF THE INVENTION

In a typical peak detector circuit, a storage capacitor (SCAP) is charged by an emitter follower driver transistor which acts as a low impedance source of signal. Even with such a source, a finite time is required for the capacitor charge to rise to the peak value of the signal. In the interests of accuracy, the SCAP should be as large as possible. However, as the size of the capacitor is increased, it takes longer for it to reach its peak charge value. Therefore, the peak detector design must be a compromise that attempts to optimize the circuit characteristics in terms of the overall function. It is to be understood that a peak detector produces a DC output which is proportional to the AC peak signal input value. As long as such proportionality is maintained, the DC output need not actually equal the peak signal input. However, if such equality is necessary, there are circuits that can provide it.

The present invention relates to a gated peak detector. Such circuits include means for electronically turning the circuit on and off in response to a gate control signal. Upon receiving the turn-on signal, the circuit output will rise up to a d-c level proportional to the a-c peak input. However, a finite time is required for the output to achieve its peak-related level and this time interval is called the response time. This response time interval can be undesirably long. It would be desirable to include means for electronically controlling the response time in the peak detector circuit.

DESCRIPTION OF THE PRIOR ART

FIG. 1 is a schematic diagram of a gated peak detector circuit in common use. The circuit operates from a $V_{CC}$ power supply connected + to terminal 10 and − to ground terminal 11. A signal input is applied to input terminal 12 and a d-c out-put appears at output terminal 13. This d-c output is proportional to the peak value of the signal input. A storage capacitor (SCAP) 14 is connected between output terminal 13 and ground and acts to integrate the signal supplied by emitter follower transistor 15. Transistor 15 acts as a low impedance charging source for capacitor 14. The circuit shown includes only the SCAP charging source and, without more, would rely upon leakage to discharge it. Typically, such a peak detector will also include discharging means which is not shown.

The base of transistor 15 is driven from input terminal 12 by differential amplifier 16. This diff-amp is composed of transistors 17 and 18 which have their emitters commonly connected to constant current transistor 19 which provides the diff-amp tail current. Transistor 19 is connected to diode 24 to form a current mirror. Resistor 21 passes the current mirror input current to diode 24 and resistors 22 and 23 develop current mirror stabilizing voltages. Typically, transistor 19 is area ratioed with respect to diode 24 to pass a multiple of the diode 24 current. Resistor 22 is proportioned to have the same ratio relationship with resistor 23.

Transistor 25 is operated as a switch driven from a gate control signal applied to terminal 26. When terminal 26 is low insert transistor 25 is off and the peak detection operation is normal. It will be noted that the base of transistor 18 comprises a inverting input of a diff-amp 16. This input is directly connected to the collector of transistor 18 which comprises the diff-amp 16 output. Thus, diff-amp 16 is connected as a noninverting voltage follower amplifier. Provided that transistors 17 and 18 are matched, the voltage applied to terminal 12 will be repeated at the base of transistor 15 without imposing any significant load to the signal input source. The action of transistor 15 will be to charge SCAP 14 to within one $V_{BE}$ of the voltage at the base of transistor 15.

When transistor 25 is turned on, by a logic high at terminal 26, it will pull the base of transistor 15 low so as to turn it off. This action will disable the operation of the circuit by disabling diff-amp 16 and emitter follower transistor 15. Transistor 25 is preferbly a Schottky clamped element, as shown, to avoid turn off delays which commonly affect saturated NPN transistors. It can be seen that if transistor 25 were a normal NPN transistor it would go into saturation when turned on. This would result in delayed turn on when terminal 26 is driven low.

The circuit of FIG. 1 has a significant problem associated with turn on. When SCAP 14 is discharged and the circuit turned on, positive peaks of substantial magnitude at terminal 12 will cause transistor 15 to conduct heavily so as to charge SCAP 14 rapidly. However, as the emitter of transistor 15 rises to approach one $V_{BE}$ below the base, the charging current will decrease. Thus, as the charge rises, the current galls off thereby delaying the rise. This results in the peak detector action being slowed down or delayed and this reaction significantly slows the detector response. When the peak detector is to be employed in servo/digital servo applications, which involve short bursts of servo information, the detector delay can have a significant effect.

SUMMARY OF THE INVENTION

It is an object of the invention to speed up the response time of a peak detector circuit.

It is a further object of the invention to electronically speed up the response of a peak detector circuit whereby the speed up is controllable.

It is a still further object of the invention to bypass the storage capacitor in a peak detector circuit with a bleed current which can be electronically controlled and acts to speed up the detector response when it is turned on.

These and other objects are achieved in the following manner. An emitter follower transistor is employed to drive a storage capacitor in the traditional peak detector circuit and a conventional circuit turnoff transistor switch is coupled to the base of the emitter follower. A bleed transistor is coupled in parallel with the storage capacitor so that when the peak detector is gated on, a bleed current is constantly being sourced by the emitter follower transistor. Since this bleed current must be supplied by the emitter follower transistor, the emitter follower will never be completely off. In effect, the bleed current ensures that the emitter follower can never have its source impedance exceed a minimum value as established by the relationship $$R_E = \frac{KT}{q}/I$$

where:

$R_E$ is the source resistance of the emitter follower transistor, $$\frac{KT}{q}$$

is the transistor thermal voltage, and
I is the transistor emitter current.
Since the value of $$\frac{KT}{q}$$

is about 26 millivolts at 300° K., a 10 microampere bleed current will result in a maximum source resistance of about 2.6K ohms. With a storage capacitor value of 200 pf, the R-C time constant is about one half microsecond.

BRIEF DESCRIPTION OF THE DRAWING

FIG. 1 is a schematic diagram illustrating a typical prior art gated peak detector circuit.

FIG. 2 is a simplified schematic diagram illustrating the circuit of the invention.

FIG. 3 is a graph showing the response of the circuit of FIG. 2 to a step function input for the open and closed switch states.

FIG. 4 is a graph showing the response of the circuit of FIG. 2 to a 1 volt symmetrical square wave having a one nanosecond period.

FIG. 5 is a schematic diagram illustrating a gated peak detector circuit employing the invention.

DESCRIPTION OF THE INVENTION

The basic invention is presented in the simplified schematic diagram of FIG. 2. Where the parts are the same as those in FIG. 1, the same numerals are employed. Emitter follower transistor 15 is coupled to charge SCAP 14 in the conventional peak detector configuration. A one volt step is applied to the base of transistor 15. When switch 28 is open, the circuit operates in the prior art state. When switch 28 is closed, the current sink 35 passes a bleed current $I_B$ out of the transistor 15 emitter. FIG. 3 is a graph showing the response of the circuit of FIG. 2 for the two switch 28 states. The coordinates are a result of a 200 pf SCAP 14 and a 10 microampere current sink 35. Curve 29 shows the prior art circuit performance of the open switch condition. Curve 30 shows the closed switch condition. It can be seen that after slightly over one microsecond, curve 30 has substantially reached its final value. However, for the prior art it can be seen that even after 12 microseconds, the curve is still rising. As a result of the invention, the circuit output will be directly proportional to the input after about a microsecond.

FIG. 4 is a graph showing the performance of the FIG. 2 circuit when a digital clock signal is applied to the base of transistor 15. A one volt symmetrical square wave having a hundred nanosecond period is applied. Curve 31 shows the open switch 28 condition and curve 32 shows the closed switch 28 condition. Both waveforms contain a ripple because capacitor 14 cannot remove all of the input signal a-c component at terminal 13. Waveform 32 contains a larger ripple component because the bleed current in sink 35 acts to discharge capacitor 14 between the input pulses. As was the case for the step function, the waveform 32 with switch 28 closed levels off after slightly over micro-second while the waveform 31, which develops with switch 28 open, continues to rise. Thus, waveform 32 shows that the incorporation of a bleed current causes the peak detector to stabilize more rapidly after turn on.

FIG. 5 is a more complete schematic diagram of the circuit of the invention when it is applied to the prior art circuit of FIG. 1. Again, where the components are the same the same numerals are employed.

Transistor 35 has its base coupled by means of resistor 36 to diode 24 and the emitter of transistor 35 is returned to ground by way of resistor 37. Thus, if transistor 25 is off, transistor 35 will mirror the current flowing in diode 24. This mirrored current is the SCAP 14 bleed current, $I_B$, which invokes the invention. The magnitude of $I_B$ is a design parameter which provides electronic control over circuit behavior. Transistor 35 is area ratioed with respect to diode 24 and resistors 22 and 37 maintain the same ratio so that $I_B$ is a controlled fraction of of the current flowing in diode 24. In the preferred embodiment of the invention, $I_B$ is set to be about 10 microamperes. Schottky transistor 38 is present so that $I_B$ can be shut off when it is desired to operate the circuit in the prior art mode. When terminal 39 is low, transistor 38 is off and the circuit operates as described above. However, when terminal 39 is high, transistor 38 will turn on and pull the base of transistor 35 down so as to shut off $I_B$. In this mode, the circuit of FIG. 5 operates in the same way as FIG. 1.

Transistor 25, which shuts the peak detector circuit off (as was the case in the FIG. 1 circuit), operates in the same way as FIG. 1 to pull the base of transistor 15 down so that the input signal cannot charge SCAP 14. However, the emitter of transistor 25 is returned to the emitter of transistor 35 and diode 40 has been added between the commonly connected emitters of transistors 25 and 35 and ground. The base of transistor 25 has been returned to $+V_{CC}$ by resistor 41. Also, an additional Schottky transistor 42 has been coupled in cascade between the base of transistor 25 and terminal 26'. Since transistor 42 operates as a logic inverter, terminal 26' operates as a GATE control input. When terminal 26' is high, transistor 42 is on thereby pulling the gate of transistor 25 low to allow the peak detector to operate normally (the peak detector on state). When terminal 26' is low (the peak detector off state,) transistor 42 will be off and resistor 41 will pull the base of transistor 25 up so as to turn it on. This base voltage rise is clamped at 2 $V_{BE}$ by the action of diode 40 and the base-to-emitter circuit of transistor 25. In this state, the voltage drop across diode 40 will turn transistor 35 off. Thus, $I_B$ is terminated. Transistor 25, being on, will turn transistor 15 is off. Thus, in the off state, the peak detector will not change the charge on SCAP 14.

EXAMPLE

The circuit of FIG. 5 may be was constructed using the following critical components:

| COMPONENT | VALUE | UNITS |
|---|---|---|
| Capacitor 14 | 200 | picofarads |
| Resistors 24 and 21 | 40K | ohms |
| Resistor 22 | 2K | ohms |
| Resistor 23 | 600 | ohms |
| Resistor 36 | 50K | ohms |
| Resistor 37 | 27K | ohms |
| Resistor 41 | 70K | ohms |

Transistor 19 was made 20/6 the area of diode 20 and transistor 35 was made 2/27 of the area of diode 24. Transistors 17 and 18 were matched. Using a 5 volt V_{CC} supply, a current of about 100 microamperes flowed in diode 20. $I_B$ flowing in transistor 35 was about 10 microamperes and the diff-amp tail current was about 270 microamperes. The step input response shown in FIG. 3 and the clock response of FIG. 4 were obtained from the operating circuit.

It should be understood that various alternatives to the embodiments of the invention described herein may be employed in practicing the invention. It is intended that the following claims define the scope of the invention and that methods and circuits within the scope of these claims and their equivalents be covered thereby.

I claim:

1. A peak detector circuit having an input terminal for responding to a source of input signals and an output terminal for providing an output signal related to the peak value of the input signal, the peak detector circuit comprising:
   a storage capacitor connected between output terminal and ground;
   an emitter follower driver transistor coupled between the input terminal and the output terminal for changing the storage capacitor;
   a bleed current transistor coupled in parallel with the capacitor and that responds to a bleed control input signal by conducting a constant bleed current such that the storage capacitor is discharged, the change developed across the storage capacitor being proportional to the peak value of the input signal; and
   a differential transistor amplifier coupled between the input terminal and the emitter follower driver transistor such that the input signal is applied to the base of the emitter follower driver transistor, the inverting input of the differential transistor amplifier being connected to the output of the differential transistor amplifier such that the differential transistor amplifier function as a unity voltage gain noninverting buffer amplifier, the differential transistor amplifier having a constant tail current that is a controlled multiple of the bleed current.

2. A peak detector circuit comprising:
   an input terminal that receives an input signal;
   an output terminal that provides an output signal;
   a storage capacitor connected between the output terminal and a negative supply voltage;
   an emitter follower driver transistor having its collector connected to a positive supply voltage and its emitter connected to the output terminal such that the emitter follower driver transistor changes the storage capacitor;
   a buffer amplifier that includes first and second buffer amplifier transistor, the first buffer amplifier transistor having its base connected to the input terminal to receive the input signal therefrom and its collector connected to the positive supply voltage, the second buffer amplifier transistor have its collector and its base commonly connected to the base of the emitter follower driver transistor and to the positive supply voltage via a first resistor, the emitter of the first and second buffer amplifier transistors being commonly connected; and
   a bleed current transistor coupled in parallel with the storage capacitor and that responds to a bleed control input signal applied to its base by conducting a constant bleed current such that the storage capacitor is discharged, the charge developed across the storage capacitor being proportional to the peak value of the input signal.

3. A peak detector circuit as in claim 2 and wherein the bleed current transistor has its collector connected to the positive supply voltage via series connected second and third resisters and to the negative supply voltage via the second resistor, a first diode and a fourth resistor connected in series.

4. A peak detector circuit as in claim 3 and further comprising:
   a constant current transistor having its collector connected to the commonly connected emitters of the first and second buffer amplifier transistors, its emitter connected to the negative supply voltage via a fifth resistor, and its base connected between the second resistor and the first diode such that the constant current transistor provides tail current for the buffer amplifier.
   a current sink transistor having its base connected to the collector of the bleed current transistor, its collector connected to the output terminal and its emitter connected to the negative supply voltage via a sixth resistor;
   a cascade transistor having its base connected to receive a gate control input signal, its collector connected to the positive supply voltage via a seventh transistor and its emitter connected to the negative supply voltage; and
   a switch transistor having its base connected to the collector of the cascade transistor, its emitter connected to the emitter of the current sink transistor, and its collector connected to the base of the second buffer amplifier transistor.

5. A peak detector circuit as in claim 4 and further comprising a second diode connected between the emitter of the current sink transistor and the negative supply voltage.

* * * * *